United States Patent [19]

Allison et al.

[11] Patent Number: 5,089,172
[45] Date of Patent: Feb. 18, 1992

[54] THICK FILM CONDUCTOR COMPOSITIONS FOR USE WITH AN ALUMINUM NITRIDE SUBSTRATE

[75] Inventors: Kevin W. Allison, Goleta; Dana L. Hankey, Santa Barbara, both of Calif.; Edward Stadnicar, Jr.; Gordon J. Roberts, both of Parma, Ohio

[73] Assignee: Ferro Corporation, Cleveland, Ohio

[21] Appl. No.: 91,081

[22] Filed: Aug. 31, 1987

[51] Int. Cl.$^5$ .............................................. H01B 1/06
[52] U.S. Cl. .................................. 252/512; 252/514; 252/518; 252/521; 501/59; 501/61; 501/66; 501/67; 501/75; 501/77
[58] Field of Search ................. 252/512, 514, 518; 501/59, 61, 66, 67, 75, 77

[56] References Cited

U.S. PATENT DOCUMENTS

| | | | |
|---|---|---|---|
| 4,219,448 | 8/1980 | Ross | 252/514 |
| 4,225,468 | 9/1980 | Donohue et al. | 252/509 |
| 4,251,397 | 2/1981 | Scheiber | 252/521 |
| 4,400,214 | 8/1983 | Ogawa et al. | 252/514 |
| 4,476,039 | 10/1984 | Hormadaly | 252/518 |
| 4,540,673 | 9/1985 | Takeda et al. | 501/96 |

FOREIGN PATENT DOCUMENTS

| | | |
|---|---|---|
| 0153737 | 9/1935 | European Pat. Off. |
| 0132810 | 2/1985 | European Pat. Off. |
| 1251766 | 10/1971 | United Kingdom |

*Primary Examiner*—Josephine Barr
*Attorney, Agent, or Firm*—Renner, Otto, Boisselle & Sklar

[57] ABSTRACT

A thick film conductor composition adapted to be bonded to an aluminum nitride substrate is provided which comprises a sufficient amount of conductive metallic material to render the conductor composition electrically conductive when bonded to the substrate, a glass frit binder for the metallic material capable of being bonded to the substrate, and a lithium containing compound capable of reacting with the substrate upon heating so as to aid in adherently bonding the conductor composition to the aluminum nitride substrate. A thick film conductor bonded onto the surface of an aluminum nitride substrate as well as a method of producing the same are also provided.

16 Claims, No Drawings

THICK FILM CONDUCTOR COMPOSITIONS FOR USE WITH AN ALUMINUM NITRIDE SUBSTRATE

FIELD OF THE INVENTION

This invention relates to thick film conductor compositions. More particularly, it concerns thick film conductor compositions which readily bond or adhere to an aluminum nitride containing substrate.

BACKGROUND OF INVENTION

The use of thick film conductor compositions in the fabrication of hybrid microelectronic components is well known in the electronics art. Broadly, such compositions include a conductive metal or alloy; a bonding material, such as glass; and a vehicle, usually an organic compound or polymer, which serves as a dispersing medium for the conducting and bonding phases of the composition.

In use, such thick film conductor compositions are applied in the desired configuration or pattern onto a suitable substrate. In this regard, substrates have been fabricated from numerous types of materials. For example, such substrate materials include alumina, beryllia, aluminum nitride, and silicon carbide.

Of the many substrate materials utilized today, one which is especially useful is aluminum nitride. However, one problem associated with its use is the limited adhesion of most thick film conductor compositions to aluminum nitride or aluminum nitride containing structures.

Accordingly, it is an object of the present invention to provide a means of bonding thick film conductor compositions to a ceramic substrate fashioned from aluminum nitride.

SUMMARY OF THE INVENTION

In one aspect, the present invention concerns a thick film conductor composition, adapted to be bonded to an aluminum nitride substrate, comprising (a) a sufficient amount of conductive metallic material to render the conductor composition electrically conductive when bonded to the substrate, (b) a glass frit binder for the metallic material capable of being bonded to the substrate, and (c) a lithium containing compound capable of reacting with the substrate upon heating so as to promote adhesion of the conductor composition to the aluminum nitride substrate.

In another aspect, the instant invention is directed to a method of adherently depositing a thick film conductor composition on an aluminum nitride substrate comprising (a) providing an aluminum nitride substrate; (b) applying to the substrate a thick film conductor composition which includes (i) a sufficient amount of conductive metallic material to render the composition electrically conductive when bonded to the substrate, (ii) a glass frit binder for the metallic material capable of being bonded to the substrate, (iii) a lithium containing compound capable of reacting with the substrate upon heating so as to help bond (adhere) the conductor composition to the aluminum nitride substrate, and (iv) an organic dispersion medium for the composition; and (c) heating the so-applied conductive composition to cause the lithium containing compound to react with the aluminum nitride substrate and cause the conductive composition to become bonded thereto.

DETAILED DESCRIPTION OF THE INVENTION

The present invention concerns a novel thick film conductive composition which is adapted for use on an aluminum nitride substrate. While it is not essential that the substrate be all aluminum nitride, it is necessary that it be present in an amount sufficient to permit the conductive composition to become bonded to the substrate by the reaction occurring between the lithium containing compound and the aluminum nitride.

As used herein the term "aluminum nitride substrate" is intended to mean a substrate containing in excess of about 40 weight percent aluminum nitride.

The specific conductive metal or alloy used in the practice of the instant invention is not critical. All that is required is that it be sufficiently conductive for the concerned application. Typical of such metals and alloys are Au, Cu, Ag, Pt, Pd-Ag, Pt-Au, Pt-Ag, Pd-Au, and various ternary compositions based on the precious metals. In practice, it has been found that the use of metal particles, particularly gold particles, having a particle size in the range of from about 0.1 micron to about 15.0 microns produces good results, with the preferred range being from about 2 to 6 microns.

The binder employed in connection with the utilization of the instant innovation is preferably a glass frit. Although the exact chemical composition of this material is not critical, the binder phase should not deleteriously react with any components of the conductive composition, have a coefficient of thermal expansion which is compatable with the substrate to which it is to be applied, and melt or flow at a sufficiently low temperature to aid in the sintering of the conductive metal particles during firing. In general, it is desired to keep the glass content as low as possible while still achieving the desired results. Likewise, the particle size is not critical, but good results have been realized when the particle size of the glass frit ranges from about 0.5 micron to about 20.0 microns, with the preferred range being from about 1 to 5 microns.

Glass frits which have been found to be exceptional useful for this purpose include those containing the listed components within the ranges specified in Table 1.

TABLE 1

| Component | Compositional Range (in weight %) |
| --- | --- |
| $SiO_2$ | 27.0–56.5 |
| BaO | 0–47.0 |
| $B_2O_3$ | 4.5–25.0 |
| PbO | 0–18.0 |
| ZnO | 0–15.0 |
| $Al_2O_3$ | 3.0–14.0 |
| $ZrO_2$ | 0–3.0 |
| MgO | 0–8.0 |
| CaO | 0–12.0 |
| $F_2$ | 0–3.0 |
| $K_2$ | 0–3.0 |
| $Na_2O$ | 0–3.0 |
| $WO_3$ | 0–4.0 |
| $LiO_2$ | 0–4.0 |

Wherein:
(1) barium oxide plus lead oxide is present in an amount at least equal to about 15.0 percent,
(2) zinc oxide plus calcium oxide plus aluminum oxide is present in an amount at least equal to about 5.0 percent, (3) calcium oxide plus magnesium oxide plus barium oxide is present in an amount at least equal to about 7.0 percent,
(4) calcium oxide plus magnesium oxide plus zirconium oxide is present in an amount at least equal to about 1.0 percent,
(5) zirconium oxide plus calcium oxide plus barium oxide is present in an amount at least equal to about 7.0 percent, and
(6) potassium oxide plus sodium oxide plus lead oxide or barium oxide is present in an amount at least equal to 10.0 percent.

Special glasses having a composition within the above ranges which are suitable for the practice of the present invention are set forth in Table 2 below.

TABLE 2

| Component | Compositional Range (in weight %) | | |
|---|---|---|---|
| | Glass A | Glass B | Glass C |
| $SiO_2$ | 37–56.5 | 38–45 | 28–45 |
| BaO | 0–24 | 10–24 | 20–40 |
| $B_2O_3$ | 4–14 | 7–14 | 7–20 |
| PbO | 0–18 | 0–17 | — |
| ZnO | 0–12.2 | 5–12.2 | — |
| $Al_2O_3$ | 3–10 | 3–8 | 2–14 |
| $ZrO_2$ | 0–3 | 0–3 | 0–3 |
| MgO | 0–6 | 0–6 | 0–8 |
| CaO | 0–8 | 0–7 | — |
| $F_2$ | 0–3 | 0–3 | — |
| $K_2O$ | 0–3 | — | — |
| $Na_2O$ | 0–3 | — | — |
| $WO_3$ | — | — | 0–4 |
| $LiO_2$ | 0–3 | 0–3 | — |

Wherein:
(1) barium oxide plus lead oxide is present in an amount at least equal to about 15.0 percent,
(2) zinc oxide plus calcium oxide plus aluminum oxide is present in an amount at least equal to about 5.0 percent,
(3) calcium oxide plus magnesium oxide plus barium oxide is present in an amount at least equal to about 7.0 percent,
(4) calcium oxide plus magnesium oxide plus zirconium oxide is present in an amount at least equal to about 1.0 percent,
(5) zirconium oxide plus calcium oxide plus barium oxide is present in an amount at least equal to about 7.0 percent, and
(6) potassium oxide plus sodium oxide plus lead oxide or barium oxide is present in an amount at least equal to 10.0 percent.

Additional special glasses which are also suitable for the practice of the instant invention include those set forth in Table 3.

TABLE 3

| Component | Compositional Range (in weight %) | | | |
|---|---|---|---|---|
| | Glass D | Glass E | Glass F | Glass G |
| $SiO_2$ | 36–43 | 40–48 | 28–38 | 50–56.5 |
| BaO | 20–25 | 8–16 | 35–40 | 0–5 |
| $B_2O_3$ | 10–16 | 6–11 | 7–20 | 3–8 |
| PbO | — | 8–18 | — | 10–18 |
| ZnO | 9–14 | 0–5 | — | — |
| $Al_2O_3$ | 3–8 | 3–7 | 8–14 | 7–11 |
| $ZrO_2$ | 0–3 | 0–3 | 0–2 | — |
| MgO | 0–6 | 0–6 | — | — |
| CaO | — | 2–8 | — | 7–12 |
| $F_2$ | — | 0–3 | — | — |
| $K_2O$ | — | — | — | 0–3 |
| $Na_2O$ | — | — | — | — |

TABLE 3-continued

| Component | Compositional Range (in weight %) | | | |
|---|---|---|---|---|
| | Glass D | Glass E | Glass F | Glass G |
| $WO_3$ | — | — | 0–4 | — |
| $LiO_2$ | — | 0–3 | — | — |
| | (a) | (b) | (c) | (d) |

(a) In Glass D, zirconium oxide plus magnesium oxide is present in an amount of at least about 1.0 percent.
(b) In Glass E, zinc oxide plus calcium oxide is present in an amount of at least 5.0 percent, magnesium oxide plus calcium oxide is present in an amount of at least 5.0 percent, zinc oxide plus calcium oxide is present in an amount of at least 3.0 percent, fluorine plus lead oxide is present in an amount of at least 9.0 percent, lithium oxide plus lead oxide is present in an amount of at least 10.0 percent.
(c) In Glass F, zirconium oxide plus tungsten oxide is present in an amount of at least 1.0 percent.
(d) In Glass G, barium oxide plus calcium oxide is present in an amount of at least 9.0 percent, potassium oxide plus calcium oxide is present in an amount of about at least 8.0 percent.

Any inert liquid can be used as the dispersing medium in the practice of the present invention. Water or any one of various organic liquids, with or without thickening and/or stabilizing agents and/or other common additives can be used as the dispersing medium. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil, the monobutyl ether of ethylene glycol monoacetate and Carbitol. The dispersing medium can contain or be composed of volatile liquids to promote fast setting after application to the substrate.

While the foregoing concerns various components used in connection with the practice of the subject invention, it is to be noted that one of the most important features of the instant innovation is the inclusion of a lithium containing compound, preferably as an admixture, in the thick film conductive composition. This material reacts with aluminum nitride at temperatures ranging from about 600° C. to about 1100° C. to form what is thought to be lithium aluminate ($LiAlO_2$). This reaction mechanism permits thick film compositions of the present invention to be adherently bonded to the substrate at the conductor/substrate interface. In this regard, it is believed that the lithium compound serves as a wetting agent to help the thick film composition to adequately wet the aluminum nitride substrate.

Suitable lithium compounds include the following:
Lithium Carbonate-$Li_2CO_3$
Lithium Hydroxide-$LiOH\ H_2O$
Lithium Fluoride-LiF
Lithium Metaborate-$LiBO_2$
Lithium Nitride-$Li_3N$
Lithium Peroxide-$Li_2O_2$
Lithium Benzoate-$LiC_7H_5O_2$
Lithium Oxalate-$Li_2C_2O_4$
Lithium Amide-$LiNH_2$
Lithium Methoxide-$LiOCH_3$ Lithium Hydride-LiH
Lithium Nitrate-LiNO$_3$
Lithium Oxide-Li$_2$O The instant invention will now be described in further detail with reference to the following examples of the preferred practice of the invention.

EXAMPLE I

| (Au Conductor Formulation) | |
|---|---|
| Component | Weight % |
| Au | 82.6 |
| Glass Binder* | 2.6 |
| Li$_2$CO$_3$ | 1.8 |
| Organic Medium | 13.0 |
| | Weight Percent |
| SiO$_2$ | 28.4 |
| B$_2$O$_3$ | 19.2 |
| BaO | 39.2 |
| Al$_2$O$_3$ | 8.6 |
| ZrO$_2$ | 1.6 |
| WO$_3$ | 3.0 |

*Glass Binder Composition

The glass binder composition was prepared in a conventional manner by mixing materials containing or producing the listed ingredients in an amount sufficient to yield a mixture having the specified compositon. This mixture was then placed in a platinum crucible and heated to about 1500° C. for about 1.5 hours. While molten, the glass composition was then poured on cold steel rolls to form thin flakes suitable for milling. These flakes were then milled to a suitable particle size (0.5 to 20 microns). The resultant glass particles were then mixed with the electrcal property modifier (gold having a particle size of about 0.5 to 15 microns) by rolling them on a 3 roll mill or shaking them in a container on a paint mixer with the resultant mixture then being dispersed into an organic printing vehicle. The organic vehicle is usually ethyl cellulose dissolved in a suitable solvent such as terpineol or butyl carbitol. If desired, known additives can be employed to regulate the rheological properties of the finished composition. The powders are dispersed into and wetted by the vehicle system by vibrating on a paint shaker. The resultant mix is then passed through a 3 roll paint mill to break up any agglomerated powder and homogenize the composition. If desired, several passes at increasing pressure can be utilized.

The so-prepared thick film composition is then applied to the aluminum nitride substrate by a modified conventional silk screen printing process in which the composition is forced through a fine mesh stainless steel screen in a desired pattern. (Typically the size of the screen varies from about 200 to 325 mesh.) The composition is then dried at approximately 100° C. for about 10 minutes to drive off the residual solvent. The dried patterns are then fired at a peak temperature of about 850° C. for about 10 minutes. The total heating time is typically about 25 to 60 minutes.

When tested, it was observed that the Au conductor layer was adherently bonded to the substrate. It had a resistance of 3.3 m Ohms/sq./mil thickness, an adhesion of 2400 psi (measured using a standard expoxied-aluminum stud pull test), and was wire bondable. Upon x-ray diffraction analysis, it appeared that the improved adhesion mechanism was due to the formation of lithium aluminate at the conductor/substrate interface.

EXAMPLE II

| (Au Conductor Formulation) | |
|---|---|
| Component | Weight % |
| Au | 82.6 |
| Glass Binder* | 2.6 |
| LiF | 1.8 |
| Organic Medium | 13.0 |
| | In Weight Percent |
| BaO | 23.9 |
| ZnO | 12.0 |
| MgO | 5.3 |
| ZrO$_2$ | 1.5 |
| SiO$_2$ | 38.9 |
| B$_2$O$_3$ | 13.4 |
| Al$_2$O$_3$ | 5.0 |

*Glass Binder Composition

The above ingredients were prepared, mixed together and applied to an aluminum nitride substrate as described in Example I.

When tested, it was observed that the Au conductor layer was adherently bonded to the substrate. It had a resistance of 4.0 m Ohms/sq./mil thickness, an adhesion of 1230 psi, and was wire bondable. Upon x-ray diffraction analysis, it appeared that the improved adhesion mechanism was due to the formation of lithium aluminate at the conductor/substrate interface.

EXAMPLE III

| (Cu Conductor Formulation) | |
|---|---|
| Component | Weight % |
| Cu | 79.9 |
| Glass Binder* | 3.4 |
| Li$_2$CO$_3$ | 1.7 |
| Organic Medium | 15.0 |
| | Compositional Range in Weight Percent |
| SiO$_2$ | 56.5 |
| B$_2$O$_3$ | 4.5 |
| PbO | 17.2 |
| Al$_2$O$_3$ | 9.0 |
| MgO | 0.6 |
| CaO | 8.0 |
| Na$_2$O | 2.4 |

*Glass Binder Composition

The above ingredients were prepared, mixed together and applied to an aluminum nitride substrate as described in Example I.

When tested, it was observed that the Cu conductor layer was adherently bonded to the substrate. It had a resistance of 2.1 m Ohms/sq./mil thickness, an adhesion of 1000 psi, and was wire bondable. Upon x-ray diffraction analysis, it appeared that the improved adhesion mechanism was due to the formation of lithium aluminate at the conductor/substrate interface.

Based on test data, good results are obtained when the thick film conductor composition comprises, in weight percent, from about 80 percent to about 99 percent conductive metallic material; from about trace amounts to about 10 percent glass frit binder; and from about trace amounts to about 4 percent of a lithium containing adhesion compound.

Typical examples of thick film conductor compositions using Au and Cu as the metallic conductor are as follows:

|   | Component | Satisfactory Range (%) | Preferred Range (%) |
|---|---|---|---|
| I. | Au | 80–99 | 92–96 |
|   | Glass | trace–10 | 1–5 |
|   | Li Compound | trace–4 | 1–3 |
| II. | Cu | 80–99 | 89–96 |
|   | Glass | trace–15 | 3–8 |
|   | Li Compound | trace–4 | 1–3 |

The above recited data delineates the inorganic proportions of the thick film composition. In practice, the organic dispersion medium or vehicle used ranges in weight percent from about 5 percent to about 20 percent of the total composition.

Various organic dispersion medium used in the practice of the present invention include ethyl cellulose resin dissolved in a suitable solvent such as terpineol, butyl Carbitol or other solvents well known in the art. However, as the specific despersion medium utilized in practice of the invention is not critical, it will not be discussed herein in detail.

While there have been described herein what are at present considered to be the preferred embodiments of this invention, it will be apparent to those skilled in the art that various changes and modifications may be made therein without departing from the invention, and it is, therefore, intended in the appended claims to cover all such changes and modifications as fall within the true spirit and scope of the invention.

We claim:

1. A thick film conductor composition adapted to be bonded to an aluminum nitride substrate comprising, in weight percent, a) from about 80 percent to about 99 percent of conductive metallic material to render said conductor composition electrically conductive when bonded to said substrate, said metallic material comprising a conductive metal selected from a group consisting of Au, Cu, Ag, and Pt;

b) from about a trace amount to about 10 percent of a glass frit binder for said metallic material capable of being bonded to said substrate, said glass frit comprising from about 27.0 to about 56.5 percent silicon dioxide, from about 0 to about 47.0 percent barium oxide, from about 4.5 to about 25.0 percent boron oxide, from about 0 to about 18.0 percent lead oxide, from about 0 to about 15.0 percent zinc oxide, from about 3.0 to about 14.0 percent aluminum oxide, from about 0 to about 3.0 percent zirconium oxide, from about 0 to about 9.0 percent magnesium oxide, from about 0 to about 12.0 percent calcium oxide, from about 0 to about 3.0 percent fluorine, from about 0 to about 3.0 percent potassium oxide, from about 0 to about 3.0 percent sodium oxide, from about 0 to about 4.0 percent tungsten oxide, and from about 0 to about 4.0 percent lithium oxide, wherein barium oxide plus lead oxide is present in an amount at least equal to about 15.0 percent, zinc oxide plus calcium oxide plus aluminum oxide is present in an amount at least equal to about 5.0 percent, calcium oxide plus magnesium oxide plus barium oxide is present in an amount at least equal to 7.0 percent, calcium oxide plus magnesium oxide plus zirconium oxide is present in an amount at least equal to about 1.0 percent, zirconium oxide plus calcium oxide plus barium oxide is present in an amount at least equal to about 7.0 percent, and potassium oxide plus sodium oxide plus lead oxide or barium oxide is present in an amount at least equal to 10.0 percent; and c) from about a trace amount to about 4.0 percent of a lithium containing compound capable of reacting with said substrate upon heating so as to promote the adhesion of said conductor composition to said aluminum nitride substrate, said lithium containing compound including at least one compound selected from the group consisting of lithium carbonate, lithium hydroxide, lithium fluoride, lithium metaborate, lithium fluoride, lithium nitride, lithium peroxide, lithium benzoate, lithium oxalate, lithium amide, lithium methoxide, lithium hydride, lithium oxide and lithium nitrate.

2. The thick film composition of claim 1 which further includes an organic dispersing medium for the inorganic components of said thick film conductor composition.

3. The thick film composition of claim 2 wherein said organic dispersing medium is present, in weight percent, in an amount ranging from about 5 percent to about 20 percent of the total weight of the composition.

4. The thick film composition of claim 1 wherein said conductive material is gold.

5. The thick film composition of claim 1 wherein said conductive material is silver.

6. The thick film composition of claim 1 wherein said conductive material is copper.

7. The thick film composition of claim 1 wherein the particles size of said metallic material ranges from about 0.5 micron to about 15.0 microns.

8. The thick film composition of claim 7 wherein the particles size of said metallic material ranges from about 1 to about 5 microns.

9. The thick film composition of claim 1 wherein said glass composition includes

| Component | Compositional Range (in weight percent) |
|---|---|
| $SiO_2$ | 37–56.5 |
| BaO | 0–24 |
| $B_2O_3$ | 4–14 |
| PbO | 0–18 |
| ZnO | 0–12.2 |
| $Al_2O_3$ | 3–10 |
| $ZrO_2$ | 0–3 |
| MgO | 0–6 |
| CaO | 0–8 |
| $F_2$ | 0–3 |
| $K_2O$ | 0–3 |
| $Na_2O$ | 0–3 |
| $LiO_2$ | 0–3 |

10. The thick film composition of claim 1 wherein said glass composition includes

| Component | Compositional Range (in weight percent) |
|---|---|
| $SiO_2$ | 38–45 |
| BaO | 10–24 |
| $B_2O_3$ | 7–14 |
| PbO | 0–17 |
| ZnO | 5–12.2 |
| $Al_2O_3$ | 3–8 |
| $ZrO_2$ | 0–3 |
| MgO | 0–6 |
| CaO | 0–7 |
| $F_2$ | 0–3 |

-continued

| Component | Compositional Range (in weight percent) |
|---|---|
| $LiO_2$ | 0-3 |

11. The thick film composition of claim 1 wherein said glass composition includes

| Component | Compositional Range (in weight percent) |
|---|---|
| $SiO_2$ | 28-45 |
| BaO | 20-40 |
| $B_2O_3$ | 7-20 |
| $Al_2O_3$ | 2-14 |
| $ZrO_2$ | 0-3 |
| MgO | 0-8 |
| $WO_3$ | 0-4 |

12. The thick film composition of claim 1 wherein said glass composition includes

| Component | Compositional Range (in weight percent) |
|---|---|
| $SiO_2$ | 28.4 |
| $B_2O_3$ | 19.2 |
| BaO | 39.2 |
| $Al_2O_3$ | 8.6 |
| $ZrO_2$ | 1.6 |
| $WO_3$ | 3.0 |

13. The thick film composition of claim 1 wherein said glass frit comprises in weight percent, from about 36.0 to about 42.0 percent silicon dioxide, from about 20.0 to about 25.0 percent barium oxide, from about 10.0 to about 16.0 percent boron oxide, from about 9.0 to about 14.0 percent zinc oxide, from about 3.0 to about 8.0 percent aluminum oxide, from about 0 to about 3.0 percent zirconium oxide, and from about 0 to about 6.0 percent magnesium oxide, wherein zirconium oxide plus magnesium is present in an amount of at least about 1.0 percent.

14. The thick film composition of claim 1 wherein said glass composition comprises, in weight percent, from about 40.0 to about 48.0 percent silicon dioxide, from about 8.0 to about 16.0 percent barium oxide, from about 6.0 to about 11.0 percent boron oxide, from about 8.0 to about 18.0 percent lead oxide, from about 0 to about 5.0 percent zinc oxide, from about 3.0 to about 7.0 percent aluminum oxide, from about 0 to about 3.0 percent zirconium oxide, from about 0 to about 6.0 percent magnesium oxide, from about 2.0 to about 8.0 percent calcium oxide, from 0 to about 3.0 percent fluorine, and from 0 to about 3.0 percent lithium oxide, wherein zinc oxide plus calcium oxide is present in an amount of at least 5.0 percent, magnesium oxide plus calcium oxide is present in an amount of at least 5.0 percent, zinc oxide plus calcium oxide is present in an amount of at least 3.0 percent, fluorine plus lead oxide is present in an amount of at least 9.0 percent and lithium oxide plus lead oxide is present in an amount of at least 10.0 percent.

15. The thick film composition of claim 1 wherein said glass composition comprises, in weight percent, from about 28.0 to about 38.0 percent silicon dioxide, from about 35.0 to about 40.0 percent barium oxide, from about 7.0 to about 20.0 percent boron oxide, from about 8.0 to about 14.0 percent aluminum oxide, from 0 to about 2.0 percent zirconium oxide, and from about 0 to about 4.0 percent tungsten oxide, wherein zirconium oxide plus tungsten oxide is present in an amount of at least 1.0 percent.

16. The thick film composition of claim 1 wherein said glass composition comprises, in weight percent, from about 50.0 to about 56.5 percent silicon dioxide, from about 0 to about 5.0 percent barium oxide, from about 3.0 to about 5.0 percent boron oxide, from about 10.0 to about 18.0 percent lead oxide, from 7 to about 11.0 percent aluminum oxide, from about 7 to about 12.0 percent calcium oxide, and from about 0 to about 3.0 percent potassium oxide, wherein barium oxide plus calcium oxide is present in an amount of at least 9.0 percent, potassium oxide plus calcium oxide is present in an amount of at least 8.0 percent.

* * * * *